United States Patent
Huang et al.

(10) Patent No.: US 12,278,143 B2
(45) Date of Patent: Apr. 15, 2025

(54) METHOD OF PROVIDING A WORKPIECE INCLUDING LOW RESISTANCE INTERCONNECT LOW-RESISTANCE INTERCONNECT

(71) Applicant: Taiwan Semiconductor Manufacturing Co., Ltd., Hsin-Chu (TW)

(72) Inventors: Hsin-Yen Huang, New Taipei (TW); Shao-Kuan Lee, Hsinchu (TW); Cheng-Chin Lee, Hsinchu (TW); Hsiang-Wei Liu, Tainan (TW); Tai-I Yang, Hsinchu (TW); Chia-Tien Wu, Taichung (TW); Hai-Ching Chen, Hsinchu (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/359,070

(22) Filed: Jul. 26, 2023

(65) Prior Publication Data
US 2023/0369114 A1 Nov. 16, 2023

Related U.S. Application Data

(60) Continuation of application No. 17/181,427, filed on Feb. 22, 2021, now Pat. No. 11,769,695, which is a (Continued)

(51) Int. Cl.
*H01L 21/76* (2006.01)
*H01L 21/768* (2006.01)
(Continued)

(52) U.S. Cl.
CPC .. *H01L 21/76885* (2013.01); *H01L 21/76829* (2013.01); *H01L 21/76834* (2013.01);
(Continued)

(58) Field of Classification Search
CPC ......... H01L 21/76805; H01L 21/76829; H01L 21/76834; H01L 21/76837; H01L 21/7684;
(Continued)

(56) References Cited

U.S. PATENT DOCUMENTS 8,030,777 B1    10/2011  van Schravendijk et al.
10,930,551 B2 *  2/2021  Huang ............... H01L 23/5226
(Continued)

FOREIGN PATENT DOCUMENTS

| | | | | |
|---|---|---|---|---|
| CN | 106486416 A | * | 3/2017 | ....... H01L 21/76843 |
| CN | 110648994 A | * | 1/2020 | ....... H01L 21/76804 |
| TW | 201712802 A | * | 4/2017 | ....... H01L 21/02019 |

OTHER PUBLICATIONS

Andrew Joseph Kelly, "Contact Etchback in room Temperature Ionic Liquid", U.S. Appl. No. 16/407,951, filed May 9, 2019, 43 pages.
(Continued)

*Primary Examiner* — Phuc T Dang
(74) *Attorney, Agent, or Firm* — HAYNES AND BOONE, LLP

(57) ABSTRACT

Integrated circuit devices and methods of forming the same are provided. A method according to the present disclosure includes providing a workpiece including a first metal feature in a dielectric layer and a capping layer over the first metal feature, selectively depositing a blocking layer over the capping layer, depositing an etch stop layer (ESL) over the workpiece, removing the blocking layer, and depositing a second metal feature over the workpiece such that the first
(Continued)

metal feature is electrically coupled to the second metal feature. The blocking layer prevents the ESL from being deposited over the capping layer.

20 Claims, 15 Drawing Sheets

Related U.S. Application Data division of application No. 16/455,840, filed on Jun. 28, 2019, now Pat. No. 10,930,551.

(51) Int. Cl.
    *H01L 23/528*     (2006.01)
    *H01L 29/45*     (2006.01)

(52) U.S. Cl.
    CPC .... *H01L 21/76837* (2013.01); *H01L 21/7684* (2013.01); *H01L 21/76886* (2013.01); *H01L 23/528* (2013.01); *H01L 29/45* (2013.01)

(58) Field of Classification Search
    CPC .. H01L 21/76886; H01L 23/528; H01L 29/45
    USPC ....................................................... 257/762
    See application file for complete search history.

(56) References Cited

U.S. PATENT DOCUMENTS

| | | |
|---|---|---|
| 2003/0186172 A1 | 10/2003 | Lu |
| 2011/0193230 A1 | 8/2011 | Nogami et al. |
| 2012/0068344 A1 | 3/2012 | Bonilla et al. |
| 2013/0277853 A1 | 10/2013 | Yang et al. |
| 2014/0061757 A1* | 3/2014 | Kim .................. H01L 29/42332 438/259 |
| 2014/0202742 A1* | 7/2014 | Jones .................. H01L 31/1884 174/253 |
| 2015/0132944 A1 | 5/2015 | Park |
| 2016/0111325 A1* | 4/2016 | JangJian ........... H01L 23/53295 257/774 |
| 2018/0033691 A1 | 2/2018 | You et al. |
| 2018/0337090 A1 | 11/2018 | Shen et al. |
| 2019/0164841 A1 | 5/2019 | St. Amour et al. |
| 2019/0267282 A1 | 8/2019 | Gstrein et al. |
| 2020/0006228 A1 | 1/2020 | Yang et al. |
| 2020/0135559 A1 | 4/2020 | Kelly |
| 2020/0411374 A1 | 12/2020 | Huang et al. |

OTHER PUBLICATIONS

Tai-I Yang et al., "Integrated Circuit Interconnect Structures with Air Gaps", U.S. Appl. No. 16/380,386, filed Apr. 10, 2019, 47 pages.

* cited by examiner

METHOD OF PROVIDING A WORKPIECE INCLUDING LOW RESISTANCE INTERCONNECT LOW-RESISTANCE INTERCONNECT

PRIORITY DATA

This is a continuation application of and claims priority to U.S. patent application Ser. No. 17/181,427, filed Feb. 22, 2021, now U.S. Pat. No. 11,769,695, which is a divisional of U.S. patent application Ser. No. 16/455,840, filed Jun. 28, 2019, now U.S. Pat. No. 10,930,551, the entire disclosures of which are herein incorporated by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, contacts of the MLI features are exhibiting increased contact resistance and impeding current flow, which presents performance, yield, and cost challenges. It has been observed that higher contact resistances and increasing current paths introduced by contacts in advanced IC technology nodes can significantly delay (and, in some situations, prevent) signals from being routed efficiently to and from IC devices, such as transistors, negating any improvements in performance of such IC devices in the advanced technology nodes. Accordingly, although existing contacts have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
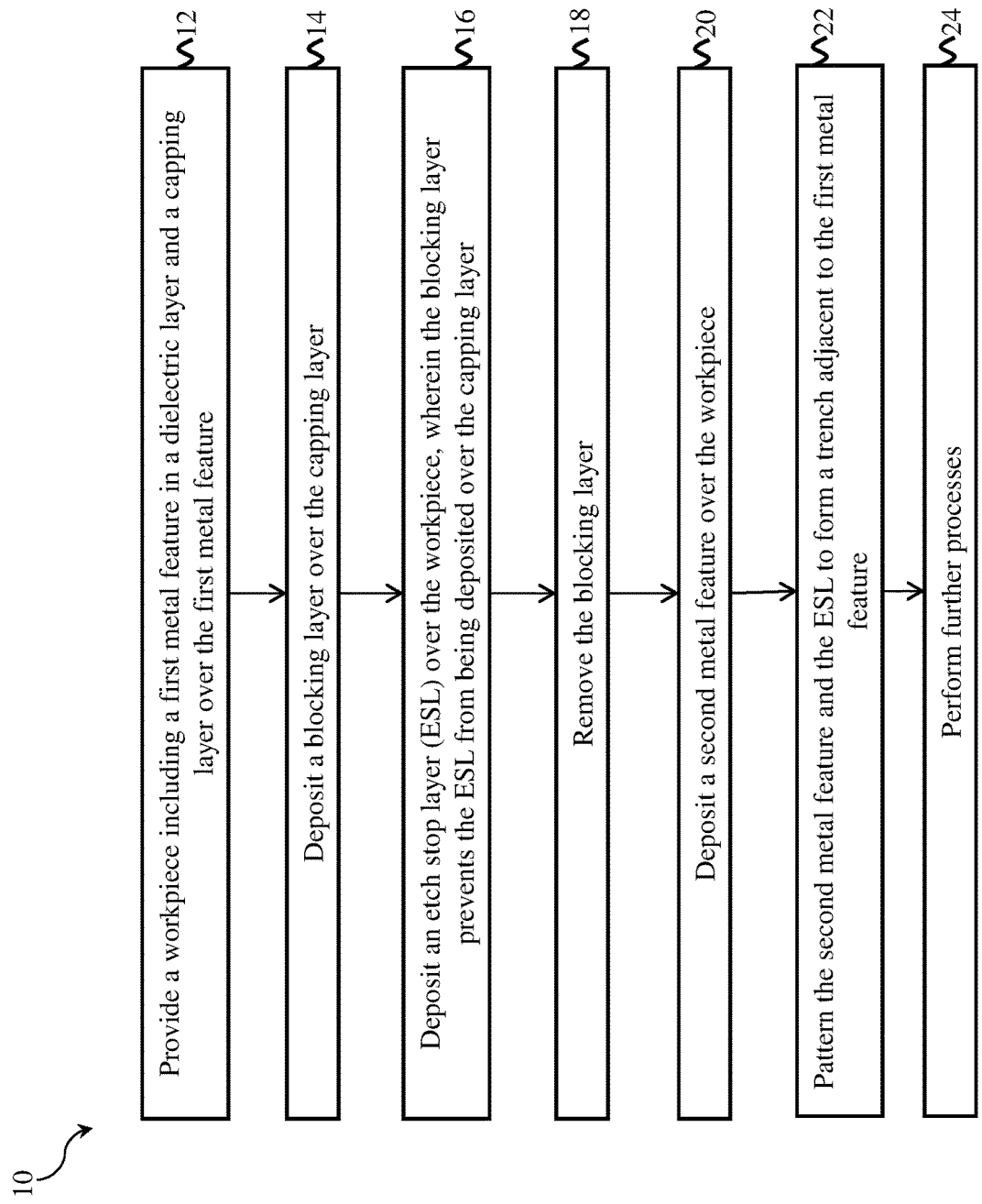
FIG. 1 is a flow chart of a method for fabricating a contact structure of an integrated circuit device according to various aspects of the present disclosure.

The present disclosure relates generally to integrated circuit (IC) devices, and more particularly, to multi-layer interconnect (MLI) features of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

The present disclosure generally relates to BEOL processes directed at fabricating an MLI structure for planar IC devices and/or non-planar IC devices (for example, fin-like field effect transistors (FinFETs)). An MLI structure may include a plurality of conductive layers. Conventionally, after a first metal layer and a capping layer thereon are formed in a dielectric layer and before a second metal layer is deposited over the capping layer, a glue layer may be deposited over the dielectric layer and the capping layer to improve the adhesion between the second metal layer and the dielectric layer. The glue layer may be formed of metal nitride, such as titanium nitride and tantalum nitride. Such metal nitride has a resistance higher than that of the first metal layer, the capping layer and the second metal layer and becomes a bottleneck of contact resistance between the first metal layer and the second metal layer. Methods for fabricating an MLI structure disclosed herein form an MLI that do not include glue layers. MLI structures disclosed herein have thus been observed to provide a low resistance current path between the first metal layer and the second metal layer. Different embodiments may have different advantages, and no particular advantage is required of any embodiment.

FIG. 1 is a flow chart of a method 10 for fabricating an MLI structure of an integrated circuit (IC) device according to various aspects of the present disclosure. At block 12, a workpiece is provided. The workpiece includes a first metal feature in a dielectric layer and a capping layer over the first metal feature. At block 14, a blocking layer is deposited over the capping layer. At block 16, an etch stop layer (ESL) is deposited over the workpiece. The blocking layer prevents the ESL from being deposited over the capping layer. At block 18, the blocking layer is removed. At block 20, a second metal feature is deposited over the workpiece. At block 22, the second metal feature and the ESL is patterned to form a trench adjacent to the first metal feature. At block 24, further processes are performed to fabricate the MLI. Such further processes may include, for example, deposition of an encapsulating layer over the workpiece, deposition of a gap-fill material over the encapsulating layer, planarization of the workpiece to expose the second metal feature. Additional steps can be provided before, during, and after the method 10, and some of the steps described can be replaced or eliminated for other embodiments of the method 10.

Blocks of the method 10 of FIG. 1 may be better described in conjunction with FIGS. 2-6, 7A, 7B, 8A, 8B, 9A, 9B, 10A, and 10B. FIGS. 2-6, 7A, 7B, 8A, 8B, 9A, 9B, 10A, and 10B are fragmentary cross-sectional diagrammatic views of a workpiece 100 of an IC device at various fabrication stages of a method, such as method 10 of FIG. 1, according to various aspects of the present disclosure. Workpiece 100 can be included in a microprocessor, a memory, and/or other IC device. In some implementations, workpiece 100 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2-6, 7A, 7B, 8A, 8B, 9A, 9B, 10A, and 10B have been simplified for the sake of clarity to better understand the inventive concepts of the present disclosure. Additional features can be added in workpiece 100, and some of the features described below can be replaced, modified, or eliminated in other embodiments of workpiece 100.

Figure 2:
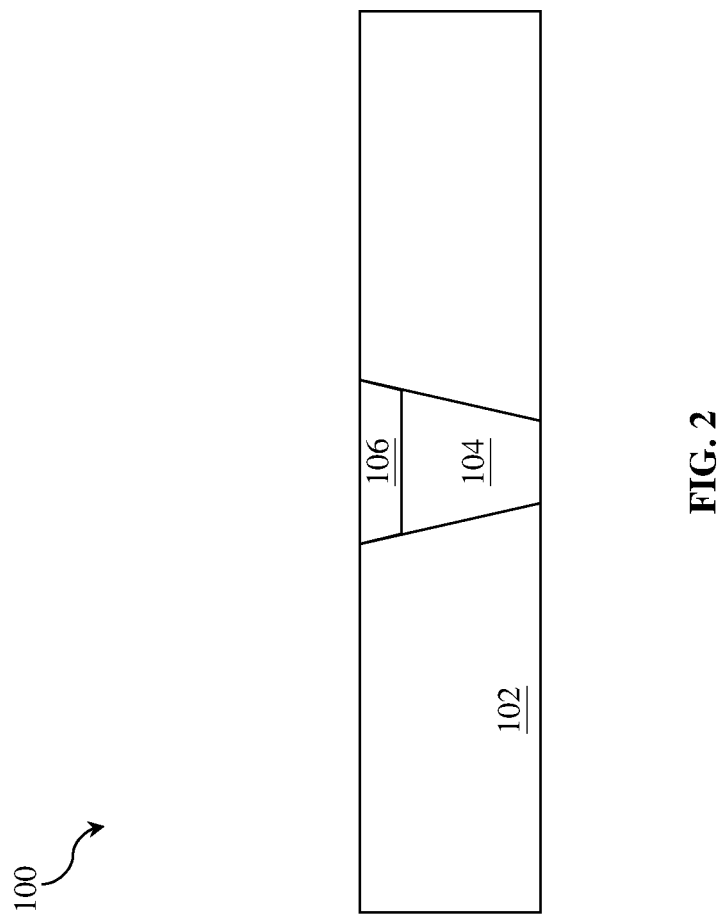
FIGS. 2-6, 7A, 7B, 8A, 8B, 9A, 9B, 10A, and 10B are fragmentary cross-sectional diagrammatic views of a contact structure at various fabrication stages of a method, such as the method of FIG. 1, according to various aspects of the present disclosure.

Reference is made to FIGS. 1 and 2. The method 10 starts with block 12 where a workpiece 100 is provided. The workpiece 100 includes a first metal feature 104 in a dielectric layer 102 and a capping layer 106 over the first metal feature 104. In some embodiments, the first metal feature 104 may include a first metal, such as copper, cobalt, ruthenium, molybdenum, chromium, tungsten, manganese, rhodium, iridium, nickel, palladium, platinum, silver, gold, aluminum, and a combination thereof. The dielectric layer 102 may include silicon oxide or other suitable dielectric material. In some embodiments, the capping later 106 may include a second metal, such as copper, cobalt, ruthenium, molybdenum, chromium, tungsten, manganese, rhodium, iridium, nickel, palladium, platinum, silver, gold, aluminum, and a combination thereof. In one embodiment, the first metal feature 104 consists essentially of the first metal, the capping layer 106 consists of the second metal, and the first metal is different than the second metal. The second metal of the capping layer 106, being different from the first metal, bestows etching selectivity up to with respect to the first metal feature 104. In some instances, the etch rate of the first metal feature 104 can be about 6 to 10 times of the etch rate of the capping layer 106. The first metal feature 104 may be referred to as M1 layer.

Figure 3:
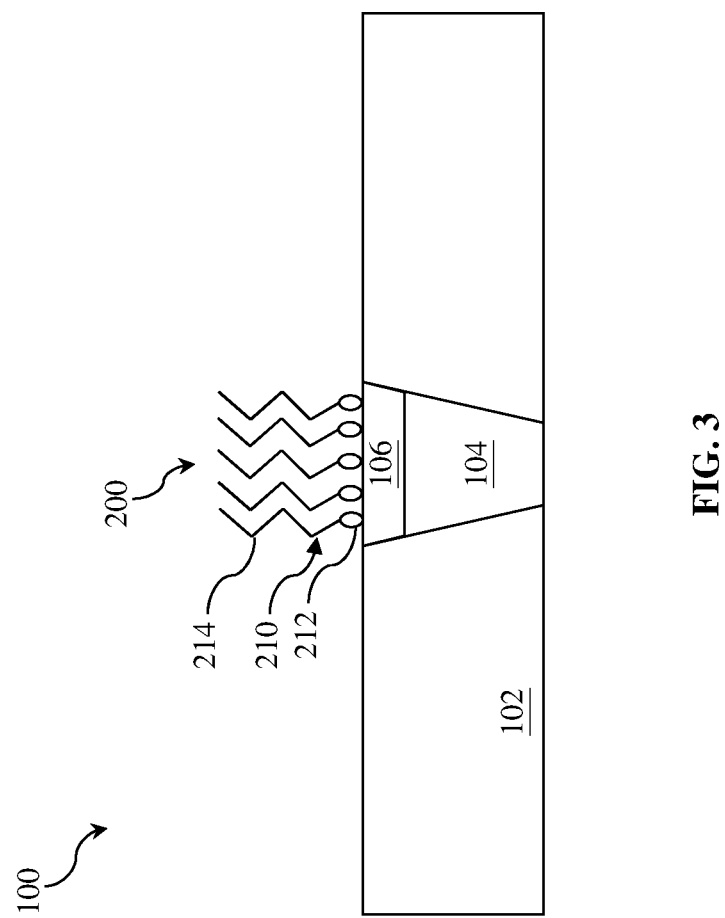

Referring now to FIGS. 1 and 3, the method 10 proceeds to block 14 where a blocking layer 200 is deposited over the capping layer 106. In some embodiments, the blocking layer 200 is deposited over the capping layer 106 by treating the entire workpiece 100 with a blocking agent 210. The blocking agent 210 includes a head group 212 and a tail 214. In those embodiments, the head group 212 includes functional groups that are bondable to surfaces of a metal, such as the top surface of the capping layer 106. In some implementations, the head group 212 may include a phosphate group, sulfate group, silanol group, thiol group, phosphinic acid group, sulfonic acid group, stearic acid group, phosphonic acid group, amine group, thiazole group, carboxamide group, or a nitrogen-containing heterocyclic group. The nitrogen heterocyclic group may include pyrrole, pyridine, adenine, thymine, triazole, or imidazole groups. In some embodiments, the tail 214 may include a bulky steric hindrance group, such as a straight hydrocarbon, a cyclic hydrocarbon, a cyclic hydrocarbon, or a branched hydrocarbon. Examples of the blocking agent 210 include 1-Octadecanethiol, 1-Dodecanethiol, Stearic acid, 4-Dodecylbenzenesulfonic acid, dimethyl octadecylphosphonate, Bi(Dodecyl) Dithiophosphinic Acids, Bi(octadecyl) Dithiophosphinic Acids, Diethyl-n-Octadecylphosphonate, Octadecylphosphonic acid, Decylphosphonic acid, Tetradecylphosphonic acid, 2-mercaptobenzothiazole, 2-mercaptobenzoxazole, 2-mercaptobenzimidazole, Benzothiazol, Benzoxazole, Benzimidazole, 2-Methylbenzimidazole, 5,6-Dimethylbenzimidazole, 2-(Methylthio)benzimidazole, 1,2,3-triazole, 1,2,4-triazole, 3-Amino-1,2,4-triazole, 1-Hydroxybenzotriazole hydrate, 4-Methyl-1H-benzotriazole, 5-Methyl-1H-benzotriazole, 5,6-Dimethyl-1H-benzotriazole, 4-Hydroxy-1H-benzotriazole, Benzotriazole-1-carboxamide, 2-Methylbenzothiazole, Imidazole, Methimazole, 5-Phenyl-1H-tetrazole, Benzotriazole, 5-(3-Aminophenyl)tetrazole, 4-Amino-4H-1,2,4-triazole, 3-Amino-5-mercapto-1,2,4-triazole, 3-Amino-5-methylthio-1H-1,2,4-triazole, 2-aminopyrimidine, 2-mercaptopyrimidine, Adenine, Hypoxanthine, Morpholine, 5-Amino-1,3,4-thiadiazole-2-thiol, Tryptophan, Histidine, 5-(Trifluoromethyl)-1H-1,2,3-benzotriazole, 1H-Benzotriazole,1-(4-morpholinylmethyl), Phenothiazine, Purine, Melamine, Trithiocyanuric acid, 1,3,4-Thiadiazole-2,5-diamine, 3,5-Diamino-1,2,4-triazole, 5-Aminotetrazole, 3,6-Bis(methylthio)-1,2,4,5-tetrazine, Aminophylline The blocking agent 210 may preferentially bond to the metallic capping layer 106, but not to the top surface of the dielectric layer 102. In some embodiments, at block 14, the blocking agent 210 may be dispersed or dissolved in an organic solvent, pre-vaporized, and fed to a deposition chamber where the blocking layer 200 is deposited at a temperature between about room temperature (about 20° C.) and about 100° C. In some instances, the blocking layer 200 may have a thickness between about 2 Å and about 50 Å.

Figure 4:
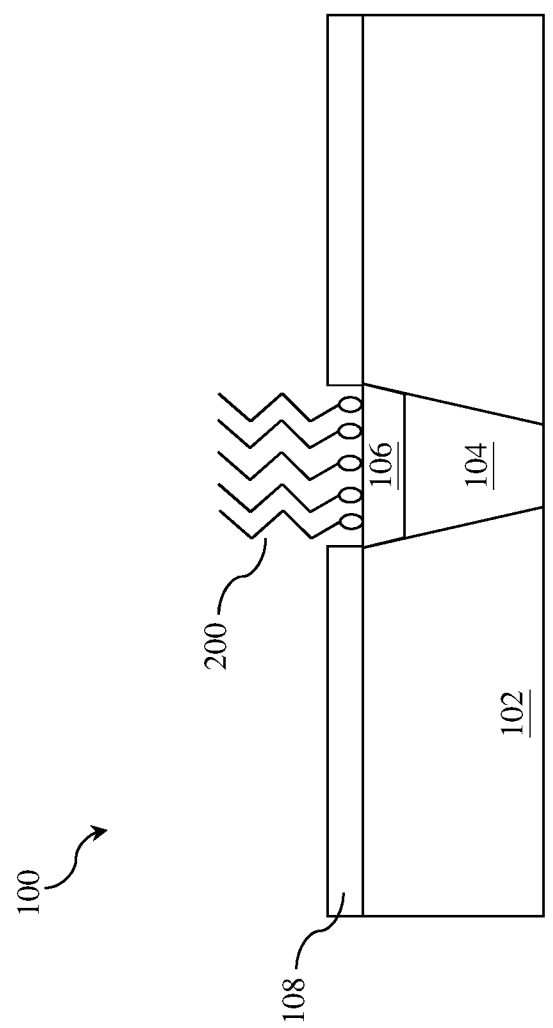

Referring now to FIGS. 1 and 4, the method 10 proceeds to block 16 where an etch stop layer (ESL) 108 is deposited over the workpiece 100. The ESL 108 may include aluminum oxide, zirconium oxide, yittrium oxide, hafnium oxide, titanium nitride, tantalum nitride, titanium oxide, or tantalum oxide. In some embodiments, the ESL 108 may be deposited over the workpiece 100 using processes that involve use of precursors of the ESL 108, such as CVD, ALD, or spin-on process. In such processes, because the precursors of the ESL 108 is sterically hindered by the bulky tail 214 of the blocking agent 210 bonded to the capping layer 106, substantially no ESL 108 will be formed on the capping layer 106. When a physical vapor deposition (PVD) is used, the blocking layer 200 may not result in selective deposition of the ESL 108 as the PVD process does not turn on presence of reactive sites or steric hindrance on the surface of the workpiece 100.

Figure 5:
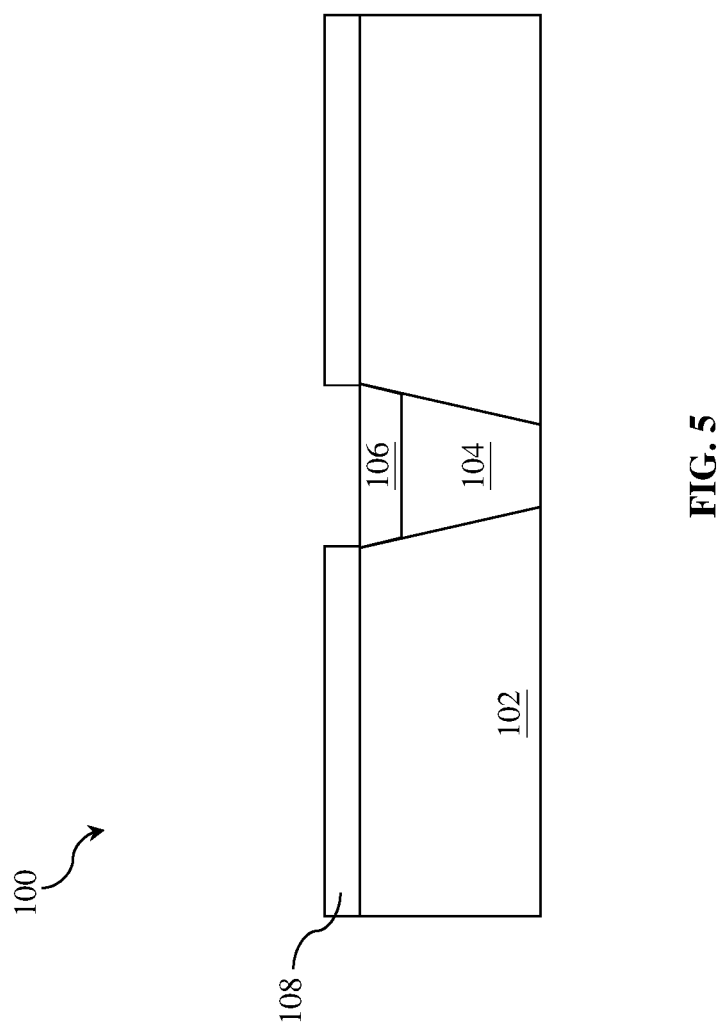

Reference is now made to FIGS. 1 and 5. The method 10 of the present disclosure proceeds to block 18 where the blocking layer 200 is removed. In some embodiments, the blocking layer 200 may be removed by dry etching using a plasma that functions as a reducing agent. For example, at block 18, the blocking layer 200 may be removed using a plasma of ammonia ($NH_3$) or hydrogen ($H_2$) diluted in argon (Ar) or helium (He).

Figure 6:
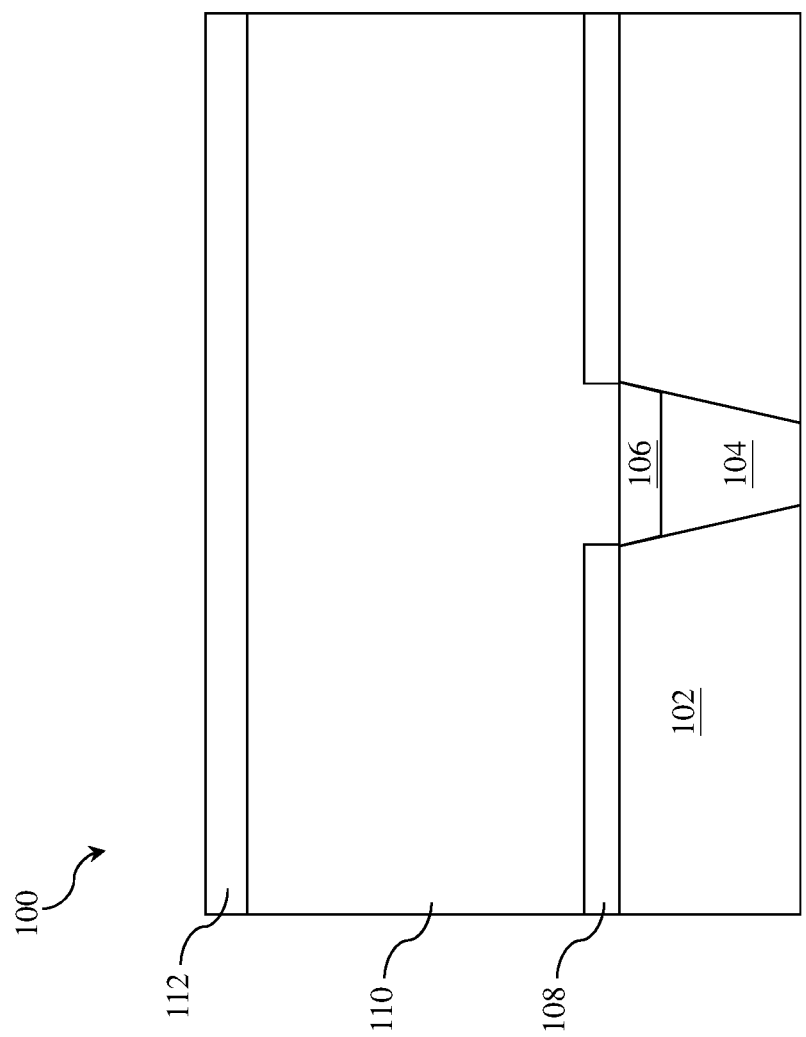

Referring now to FIGS. 1 and 6, the method 10 proceeds to block 20 where the second metal feature 110 is deposited over the workpiece 100. In some embodiments, the second metal feature 110 may include copper, cobalt, ruthenium, molybdenum, chromium, tungsten, manganese, rhodium, iridium, nickel, palladium, platinum, silver, gold, and aluminum. In some implementations, the second metal feature 110 is formed of a third metal selected from copper, cobalt, ruthenium, molybdenum, chromium, tungsten, manganese, rhodium, iridium, nickel, palladium, platinum, silver, gold, and aluminum. In some instances, the third metal may be identical to the first metal but is different from the second metal. The second metal feature 110 may be deposited using PVD, CVD, or ALE. In the embodiments represented in FIG. 6, the second metal feature 110 is deposited over the capping layer 106 and the ESL 108. In addition, in some implementations, the workpiece 100 may be planarized using, for example, CMP, before the method 10 proceeds to block 22. The second metal feature 110 is electrically coupled to the first metal feature 104 via the capping layer 106.

Figure 7A:
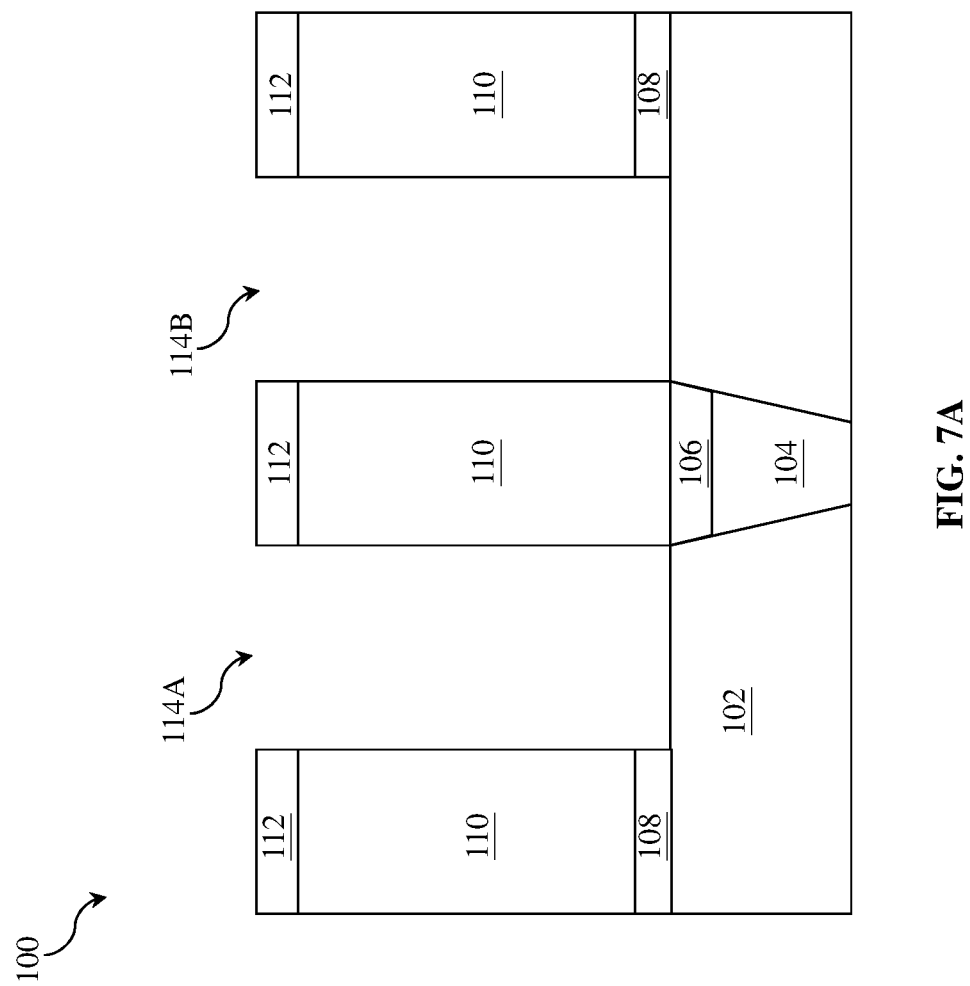
Figure 7B:
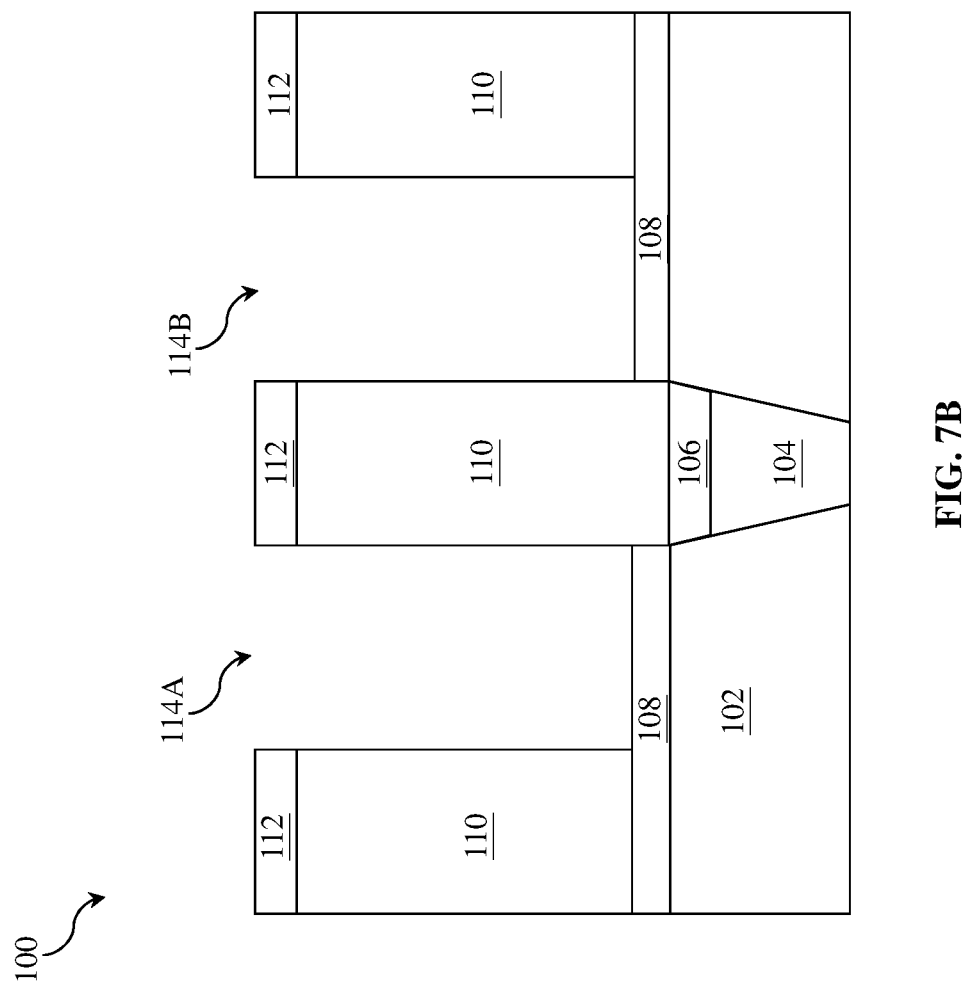

Reference is now made to FIGS. 1, 7A and 7B. The method 10 of the present disclosure proceeds to block 22 where the second metal feature 110 and the ESL 108 are patterned to form a trench (114A or 114B) adjacent to the first metal feature 104. In embodiments shown in FIG. 7A, the ESL 108 in the trench 114A or 114B are completely removed. In alternative embodiments shown in FIG. 7B, the ESL 108 I the trench 114A or 114B are not completely removed. In some embodiments, the patterning may be achieved using lithography techniques. A hard mask layer 112 is formed over the second metal feature 110 and then a photoresist layer may be formed over the hard mask layer 112. The photoresist layer and the hard mask layer 112 are then patterned to serve as an etch mask for etching the underlying second metal feature 110 and the ESL 108. In some embodiments, the hard mask layer 112 may include more than one layer, such as a silicon nitride layer and a silicon oxide layer over the silicon nitride layer. In some implementations, the second metal feature 110 may be etched using a dry etching or a wet etching process. For example, when the second metal feature 110 is formed of tungsten, it may be etched using tetrafluoromethane ($CF_4$) gas in a dry etching process or may be etched using a mixture containing nitric acid in a wet etching process. In some instances, a different etching process may be used to etch the ESL 108 in the trench 114A or 114B. In some implementations, the ESL 108 may be etched using a wet etching process. For example, the ESL 108 may be etched using an acidic or basic etchant, such as phosphoric acid, ammonia fluoride, or alkylamine.

In embodiments where the ESL 108 is formed of a conductive material, such as titanium nitride and tantalum nitride, the ESL 108 in the trench (114A or 114B) is to be completely removed to prevent short circuit, as illustrated in FIG. 7A. In other embodiments whether the ESL 108 is formed of a non-conductive metal oxide, such as aluminum oxide, zirconium oxide, yittrium oxide, or hafnium oxide, while it is desirable to remove the ESL 108 to reduce parasitic capacitance, it may not be necessary to completely remove the ESL 108 in the trench (114A or 114B), as illustrated in FIG. 7B.

Figure 8A:
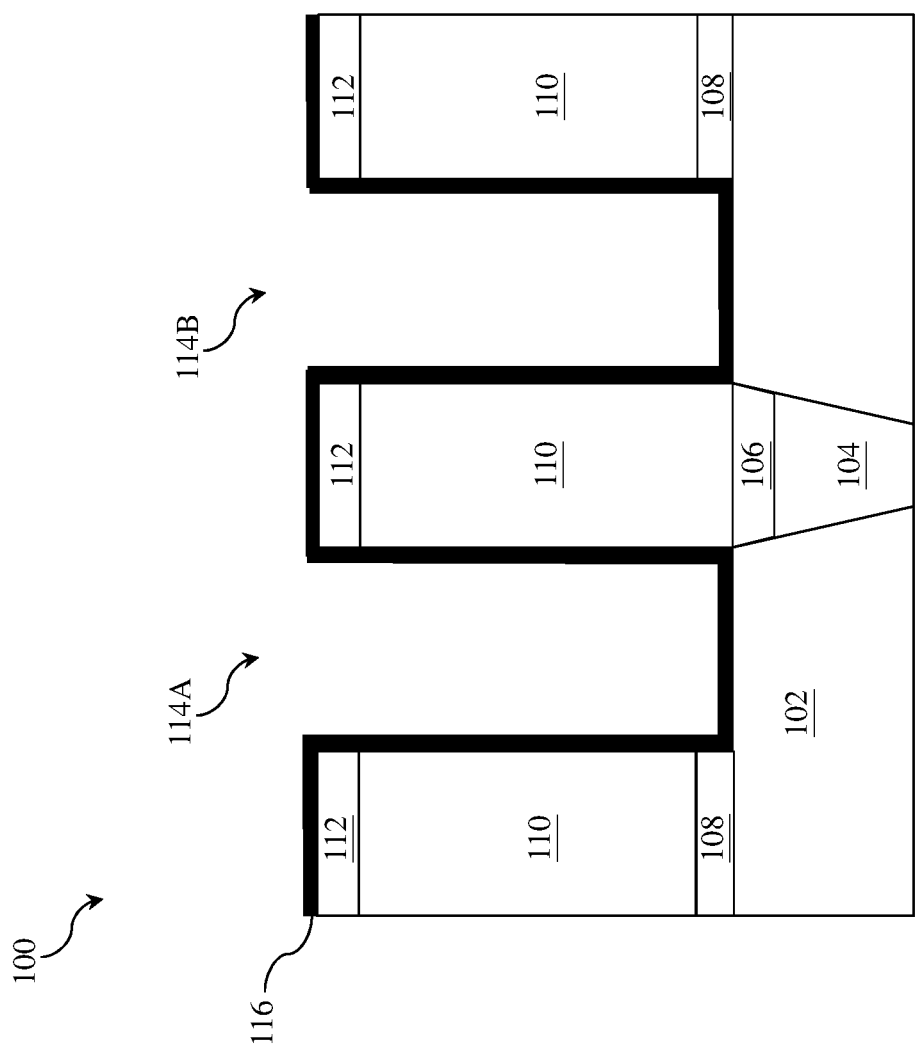
Figure 8B:
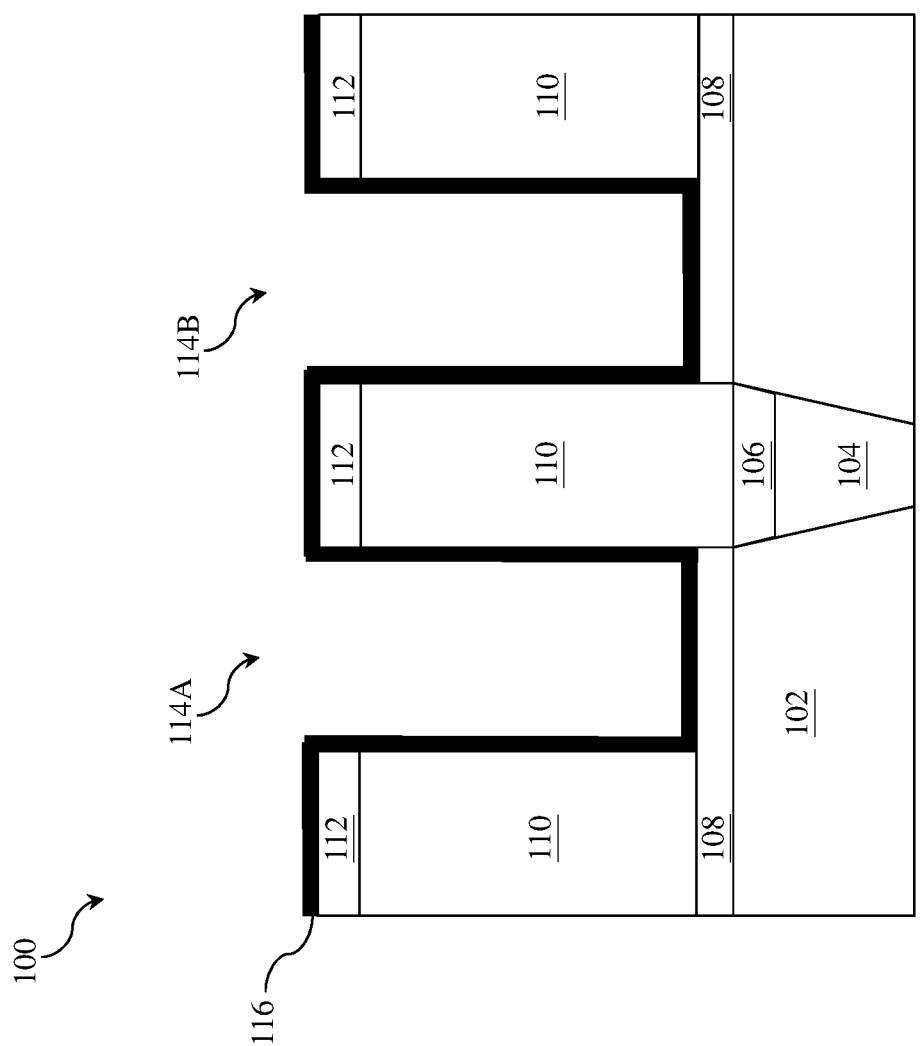
Figure 9A:
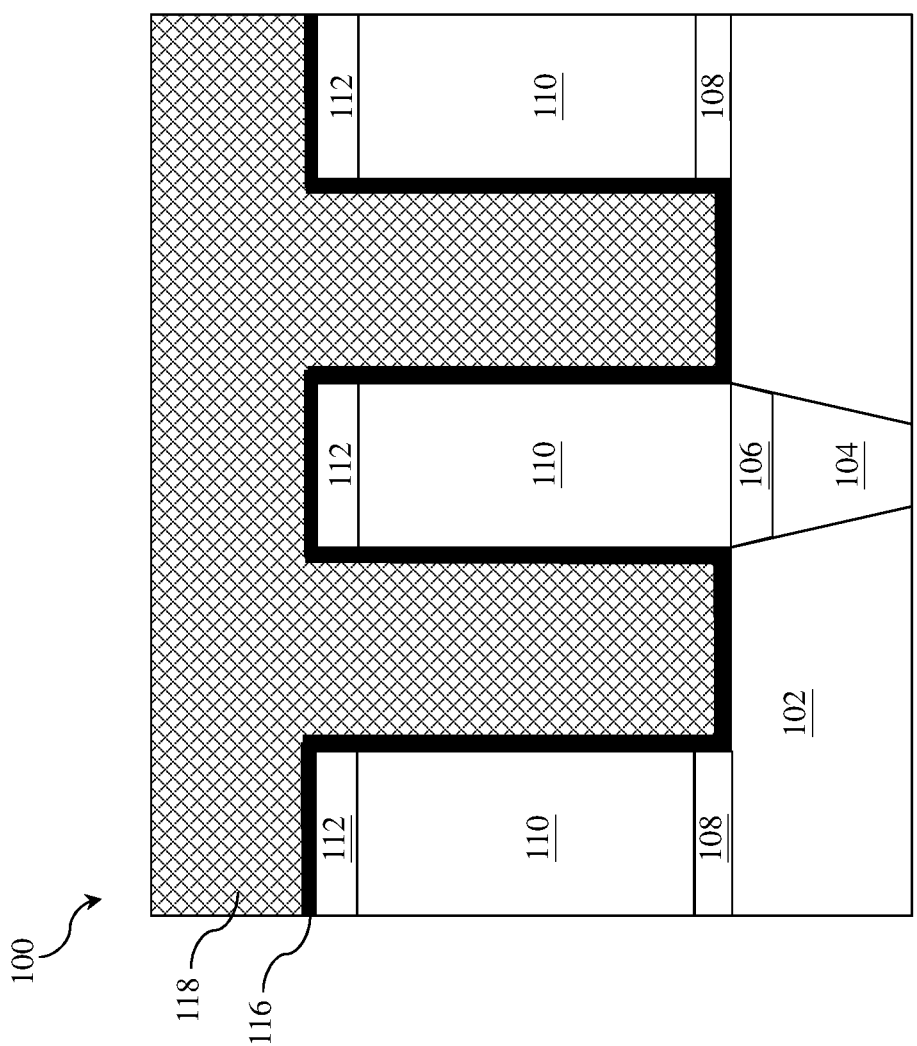
Figure 9B:
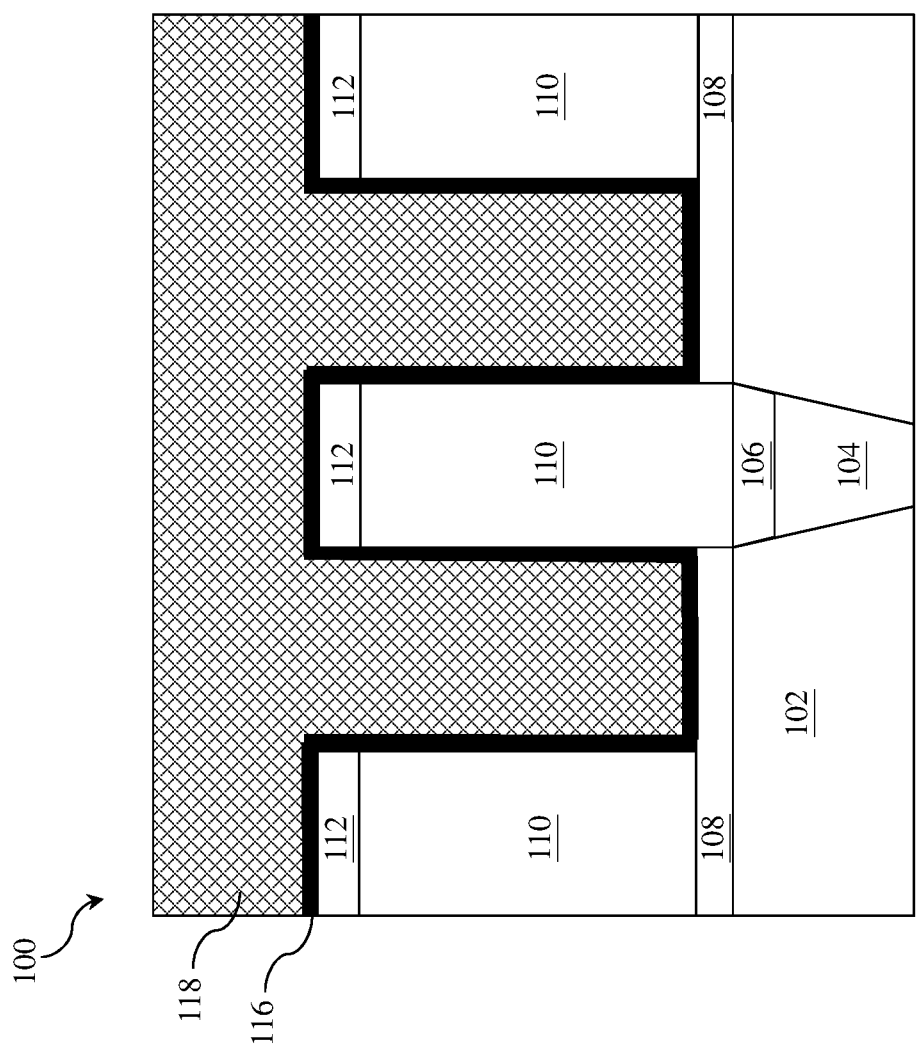
Figure 10A:
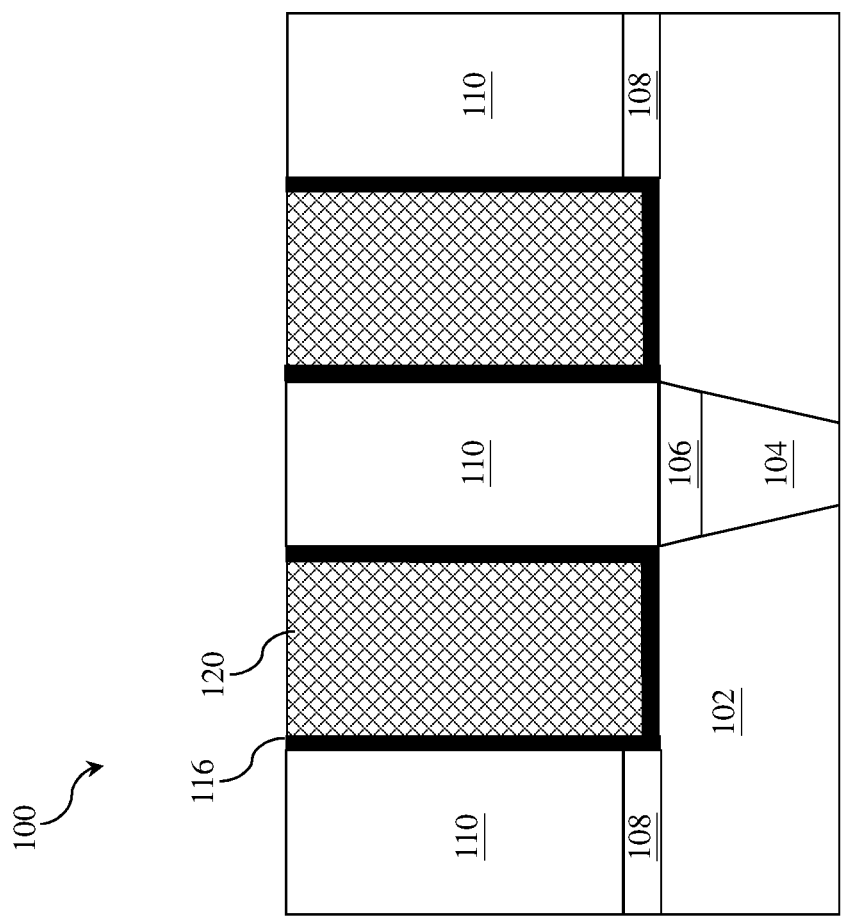
Figure 10B:
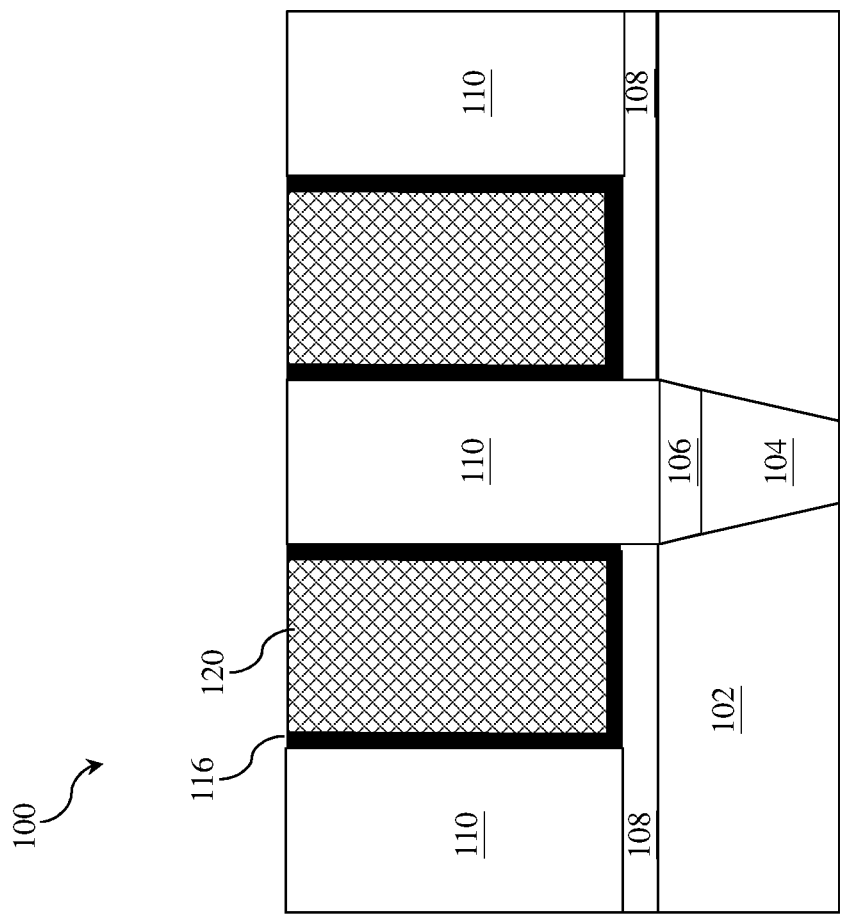

Referring now to FIGS. 1, 8A, 8B, 9A, 9B, 10A, and 10B, the method 10 of the present disclosure proceed to block 24 where further processes are performed to fabricate the MLI. FIGS. 8A, 9A and 10A illustrate embodiments where the ESL 108 in the trench (114A or 114B) is completely removed while FIGS. 8B, 9B and 10B illustrate embodiments where the ESL 108 in the trench (114A or 114B) is not completely removed. Reference is now made to FIGS. 8A and 8B. In some embodiments, an encapsulating layer 116 is conformally formed over the workpiece 100, including over sidewalls of the trench (114A or 114B) and over the hard mask layer 112. As show in FIG. 8A or 8B, sidewalls of the second metal feature 110 are lined by the encapsulating layer 116. In some implementations, the encapsulating layer 116 may include silicon oxide, silicon oxycarbide, silicon oxynitride, silicon carbonitride, silicon oxy-carbonitride, or combinations thereof. In some instances, the encapsulating layer 116 may be formed using a suitable process, such as PVD, CVD, or ALD and may be formed to a thickness between about 2 Å and about 50 Å. Referring now to FIGS. 9A and 9B, in some embodiments, a gap-fill material 118 is deposited over the workpiece 100. The gap-fill material 118 may include a low-K material, such as silicon oxide doped with hydrocarbons. In some implementations, the low-K material may be silicon oxide doped with hydrocarbons and may be porous for low K value. Reference is now made to FIGS. 10A and 10B, in some embodiments, the workpiece 100 may be planarized using CMP until a top surface of the second metal feature 110 is reached (exposed). In the embodiments represented in FIG. 10A or 10B, a top surface of the gap-fill material 120 and a top surface of the second metal feature 110 may be coplanar. Still further processes may be performed on the workpiece 100. For example, another metal feature may be formed over the second metal feature 110 to forma another conductive layer of the MLI. In some instances, the first metal feature 104 may be referred to as the metal-1 or M1 and the second metal feature 110 may be referred to as metal-2 or M2.

Figure 11:
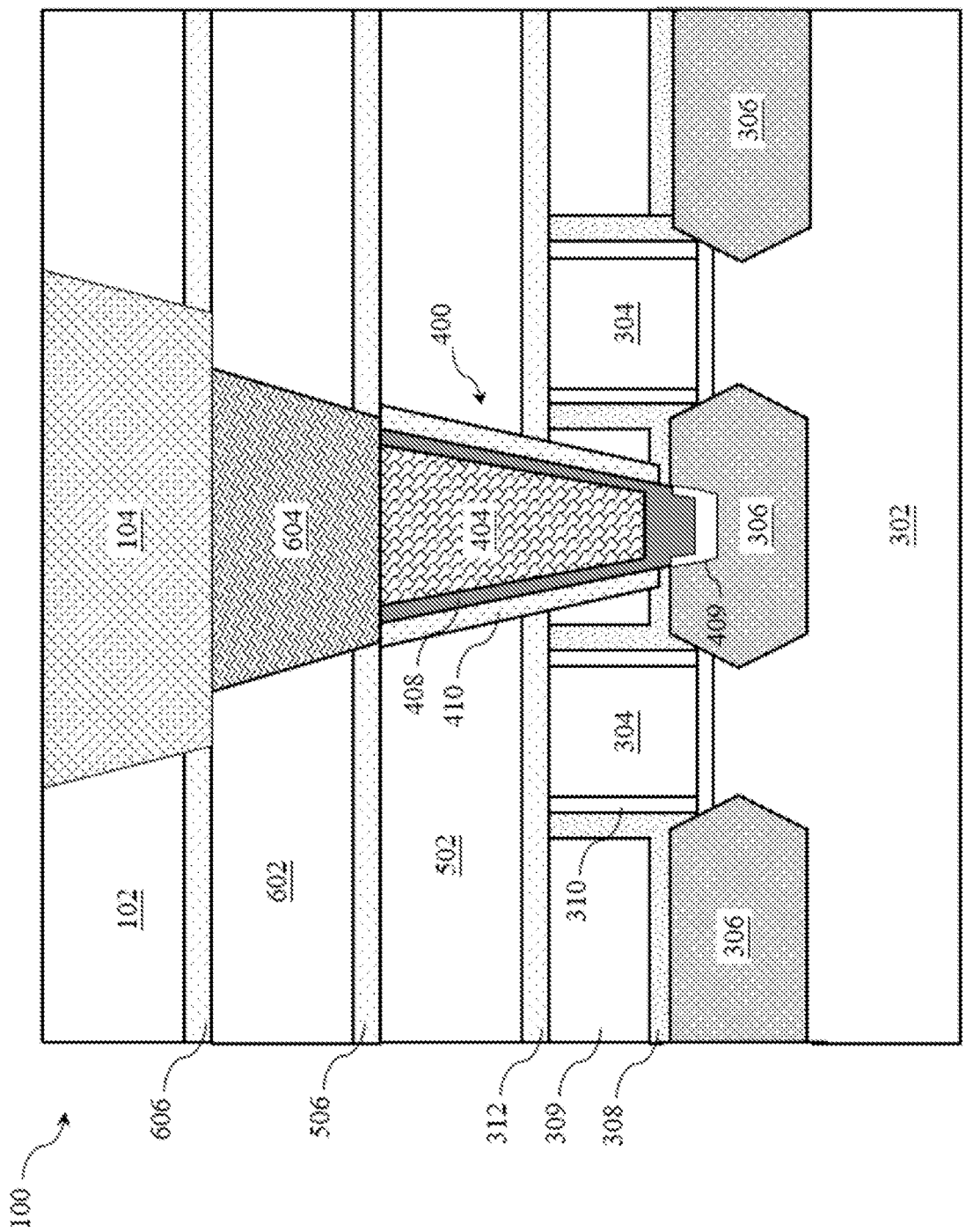
FIG. 11 is a cross-sectional diagrammatic view of structures underlying a contact structure, according to various aspects of the present disclosure.

Referring now to FIG. 11, shown therein is a cross-sectional diagrammatic view of structures of the workpiece 100 underlying an MLI structure, such as that shown in FIG. 10A or 10B. The workpiece 100 may include a substrate 302 that is formed of silicon. Alternatively or additionally, the substrate 302 includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 302 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 302 can include various doped regions (not shown). In some implementations, substrate 302 includes p-type doped regions (for example, p-type wells) doped with p-type dopants, such as boron (for example, $BF_2$), indium, other p-type dopant, or combinations thereof. In some implementations, substrate 302 includes n-type doped regions (for example, n-type wells) doped with n-type dopants, such as phosphorus, arsenic, other n-type dopant, or combinations thereof. In some implementations, substrate 302 includes doped regions formed with a combination of p-type dopants and n-type dopants. The various doped regions can be formed directly on and/or in substrate 302, for example, providing a p-well structure, an n-well structure, a dual-well structure, a raised structure, or combinations thereof. An ion implantation process, a diffusion process, and/or other suitable doping process can be performed to form the various doped regions.

Various gate structures are disposed over substrate 302, such as gate structures 304. Gate structures 304 each interpose a source region and a drain region, where a channel region is defined in substrate 302 between the source region and the drain region. Gate structures 304 engage the channel regions, such that current can flow between the source/drain regions during operation. In some implementations, gate structures 304 are formed over a fin structure, such that gate structures 304 each wrap a portion of the fin structure. For example, gate structures 304 wrap channel regions of the fin structure, thereby interposing source regions and drain regions of the fin structure. Gate structures 304 include a gate dielectric and a gate electrode. The gate dielectric is disposed on substrate 302, and the gate electrode is disposed on the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k 3.9). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, barrier layers, and/or metal fill (or bulk) layers. A capping layer can include a material that prevents and/or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A barrier layer can include a material that promotes adhesion between adjacent layers, such as the work function layer and the metal fill layer, and/or a material that blocks and/or reduces diffusion between gate layers, such as the work function layer and the metal fill layer. For example, the barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Gate structures 304 further respectively include gate spacers 310. Gate spacers 310 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 302 and subsequently anisotropically etched to form gate spacers 310. In some implementations, gate spacers 310 include a multi-layer structure, such as a first dielectric layer that includes silicon nitride and a second dielectric layer that includes silicon oxide. In some implementations, gate spacers 310 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 302 and subsequently anisotropically etched to form a first spacer set adjacent to gate stacks, and a second dielectric layer including silicon and nitrogen can be deposited over substrate 302 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in source/drain (S/D) regions before and/or after forming gate spacers 310.

Epitaxial source features and epitaxial drain features (referred to as epitaxial source/drain features 306) are disposed in source/drain regions of substrate 302. For example, a semiconductor material is epitaxially grown on substrate 302, forming epitaxial source/drain features 306 over source/drain regions of substrate 302. In the depicted embodiment, gate structures 304 interpose respective epitaxial source/drain features 306, and respective channel regions are defined in substrate 302 between respective epitaxial source/drain features 306 underneath respective gate structures 304. The IC device formed on the workpiece 100 can thus be configured to include a transistor including gate structure 304 and its corresponding epitaxial source/drain features 306. In some implementations, epitaxial source/drain features 306 wrap source/drain regions of one or more fin structures extending from substrate 302, such that the transistors are configured as FinFETs. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable selective epitaxial growth (SEG) processes, or combinations thereof. The epitaxy process can use gaseous and/or liquid precursors, which interact with the composition of substrate 302. Epitaxial source/drain features 306 may be doped with n-type dopants and/or p-type dopants. In some implementations, where a transistor is configured as an n-type device, epitaxial source/drain features 306 can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device, epitaxial source/drain features 306 can be silicon-and-germanium-containing epitaxial layers doped with boron, other p-type dopant, or combinations thereof (for example, forming Si:Ge:B epitaxial layers). In some implementations, epitaxial source/drain features 306 include materials and/or dopants that achieve desired tensile stress and/or compressive stress in the channel region. In some implementations, epitaxial source/drain features 306 are doped during deposition by adding impurities to a source material of the epitaxy process. In some implementations, epitaxial source/drain features 306 are doped by an ion implantation process after a deposition process. In some implementations, annealing processes are performed to activate dopants in epitaxial source/drain features 306 and/or other source/drain regions of the IC device on the workpiece 100.

An isolation feature(s) 309 is formed over and/or in substrate 302 to isolate various regions, such as various device regions, of the IC device on the workpiece 100. For example, isolation features define and electrically isolate active device regions and/or passive device regions from each other. In some implementations, an isolation feature can be configured to isolate transistors corresponding with gate structures 304 and epitaxial source/drain features 306 from other transistors, devices, and/or regions of the IC device on the workpiece 100. Isolation features 309 include an isolation material, such as silicon oxide, silicon nitride, silicon oxynitride, other suitable isolation material (for example, including silicon, oxygen, nitrogen, carbon, and/or other suitable isolation constituent), or combinations thereof. Isolation features can include different structures, such as shallow trench isolation (STI) structures, deep trench isolation (DTI) structures, and/or local oxidation of silicon (LOCOS) structures. In some implementations, isolation features 309 can be formed by etching trenches in substrate 302 (for example, by using a dry etch process and/or wet etch process) and filling the trenches with insulator material (for example, by using a chemical vapor deposition process or a spin-on glass process). A chemical mechanical polishing (CMP) process may be performed to remove excessive insulator material and/or planarize a top surface of the isolation features 309. In some implementations, isolation features 309 can be formed by depositing an insulator material over substrate 302 after forming fins, such that the insulator material layer fills gaps (trenches) between fins, and etching back the insulator material layer. In some implementations, isolation features include multilayer structures that fill trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features 309 include a dielectric layer disposed over a doped liner layer (including, for example, boron silicate glass or phosphosilicate glass).

The structure shown in FIG. 11 further includes one or more contact etch stop layers (CESL) disposed over substrate 302, such as a CESL 308 disposed between isolation features 309 and device-level features (here, gate structures 304 and epitaxial source/drain features 306), a CESL 312 disposed between isolation features 309 and ILD layer 502, a CESL 506 between ILD layer 502 and the ILD layer 602, and a CESL 606 between the ILD layer 602 and the ILD layer 102. These CESLs 308, 312, 506 and 606 include a material different than isolation features 309, ILD layer 502, ILD layer 602, and ILD layer 102 to achieve etching selectivity during processing, such that these CESLs can be selectively etched relative to ILD layers (in other words, with no or minimal etching of ILD layers), and vice versa. For example, these CESLs include a dielectric material that is different than the dielectric material of ILD layers. The dielectric material can be silicon oxide, silicon nitride, silicon oxynitride, silicon carbide, silicon oxycarbonitride, other suitable dielectric material (for example, including silicon, oxygen, nitrogen, carbon, and/or other suitable isolation constituent), or combinations thereof. In the depicted embodiment, where isolation feature 309, ILD layers 502, 602, and 102 include an oxygen-containing material, CESLs 308, 312, 506 and 606 include a nitrogen-containing material. For example, CESLs 308, 312, 506 and 606 include silicon and nitrogen, such as silicon nitride or silicon oxynitride, such that CESLs 308, 312, 506 and 606 can be referred to as nitride layers. In some implementations, CESLs 308, 312, 506 and 606 can include a multilayer structure having multiple dielectric materials. CESLs 308, 312, 506 and 606 are formed by a deposition process, such as CVD, PVD, ALD, HDPCVD, MOCVD, RPCVD, PECVD, LPCVD, ALCVD, APCVD, other suitable methods, or combinations thereof.

In some embodiments, the CESL 506 and CESL 606 may be formed using a blocking layer, such as the blocking layer 200 in method 10. In these embodiments, CESLs 506 and 606 may be formed using CVD, ALD, or spin-on coating such that the precursors of CESLs 506 and 606 may be prevented from bonding to the metal features to which the blocking layer is bonded.

The structure shown in FIG. 11 includes a source/drain contact 400 to electrically couple to the epitaxial source/drain feature 306. In some embodiments represented in FIG. 11, the source/drain contact 400 includes a source/drain contact spacer 410, a source/drain contact liner 408, and a source/drain contact bulk layer 404. In some implementations, the source/drain contact 400 extends through the ILD layer 502, CESL 312, the isolation feature 309, and the CESL 308 to reach the recessed epitaxial source/drain feature 306. In some embodiments, the source/drain contact spacer 410 may include a material different than the ILD layers to achieve etching selectivity. The material for the source/drain contact spacer may include silicon oxide, silicon nitride, silicon oxynitride, silicon carbide, silicon oxycarbonitride, other suitable dielectric material (for example, including silicon, oxygen, nitrogen, carbon, and/or other suitable isolation constituent), or combinations thereof. In some implementations, the source/drain contact liner 408 may be formed of titanium, titanium alloy, tantalum, tantalum alloy, cobalt, cobalt alloy, ruthenium, ruthenium alloy, molybdenum, molybdenum alloy, other suitable constituent, or combinations thereof. In some embodiments, the source/drain contact bulk layer 404 may be formed of cobalt, tungsten, or ruthenium. In some embodiments, the source/drain contact liner 408 and the source/drain contact bulk layer 404 may be formed using PVD, CVD, ALD, electroplating, electroless plating, other suitable deposition process, or combinations thereof. In some embodiments, an anneal may be performed to form a metal silicide feature 409 by reacting the source/drain contact liner 408 and the recessed epitaxial source/drain feature 306. In some instances, the metal silicide feature 409 may include titanium silicide, tantalum silicide, cobalt silicide, ruthenium silicide, or molybdenum silicide.

In some embodiments, the structure in FIG. 11 may include a third metal feature 604 that is electrically coupled to the first metal feature 104. The third metal feature 604 may be referred to as metal-0 or M0, as compared to M1 and M2 overlying the third metal feature 604. The third metal feature 604 may have similar composition to the first metal feature 104 and may be formed using processes similar to those to form the first metal feature 104.

Embodiments of the present disclosure provide advantages. The present disclosure provides methods, such as method 10, to form an MLI structure without high-resistance metal nitride layer between metal features to lower resistance while maintaining good adhesion between the ILD and metal features. The present disclosure also provides a low-resistance MLI structures, such as that shown in FIG. 10A or 10B, formed using methods of the present disclosure. In addition, the methods of the present disclosure are compatible metal nitride materials used in conventional glue layers.

The present disclosure provides for many different embodiments. In one embodiment, a method is provided. The method includes providing a workpiece including a first metal feature in a dielectric layer and a capping layer over the first metal feature; selectively depositing a blocking layer over the capping layer; depositing an etch stop layer (ESL) over the workpiece; removing the blocking layer; and depositing a second metal feature over the workpiece such that the first metal feature is electrically coupled to the second metal feature. The blocking layer prevents the ESL from being deposited over the capping layer.

In some embodiments, the depositing of the ESL includes depositing the ESL using chemical vapor deposition (CVD), atomic layer deposition (ALD), or spin-on coating. In some implementations, the method further includes patterning the second metal feature and the ESL to form a trench adjacent to the first metal feature such that the dielectric layer is exposed in the trench. In some instances, the method further includes depositing an encapsulating layer over the workpiece, including over sidewalls of the trench; depositing a gap-fill material over the encapsulating layer; and planarizing the workpiece to expose the second metal feature. In some embodiments, the encapsulating layer includes silicon oxide, silicon oxycarbide, silicon oxynitride, silicon carbonitride, or silicon oxy-carbonitride. The gap-fill material includes silicon oxide doped with hydrocarbons. In some implementations, the blocking layer includes a blocking agent and the blocking agent includes a head group and a tail. The head group may include a phosphate group, a sulfate group, a silanol group, a thiol group, a phosphinic acid group, a sulfonic acid group, a stearic acid group, a phosphonic acid group, an amine group, a thiazole group, a carboxamide group, or a nitrogen-containing heterocyclic group. The tail may include a straight hydrocarbon, a cyclic hydrocarbon, a cyclic hydrocarbon, or a branched hydrocarbon. In some embodiments, the first metal feature consists essentially of a first metal and the capping layer consists essentially of a second metal different from the first metal. The first metal and the second metal are selected from the group consisting of copper, cobalt, ruthenium, molybdenum, chromium, tungsten, manganese, rhodium, iridium, nickel, palladium, platinum, silver, gold, and aluminum. In some instances, the ESL includes oxides of aluminum, zirconium, yittrium, or hafnium.

In another embodiment, a method is provided. The method includes providing a workpiece including a first metal feature in a dielectric layer and a capping layer over the first metal feature; treating the workpiece with a blocking agent having a head group bondable to a top surface of the capping layer; depositing an etch stop layer (ESL) over the workpiece; removing the blocking agent to expose the top surface of the capping layer; and depositing a second metal feature over the workpiece such that the first metal feature is electrically coupled to the second metal feature via the capping layer. The blocking agent prevents the ESL from being deposited over the top surface of the capping layer.

In some implementations, the depositing of the ESL includes depositing the ESL without using physical vapor deposition (PVD). In some embodiments, the method further includes patterning the second metal feature and the ESL to form a trench adjacent to the first metal feature such that the dielectric layer is exposed in the trench. In some embodiments, the method may further include depositing an encapsulating layer over the workpiece, including over sidewalls of the trench; depositing a gap-fill material over the encapsulating layer; and planarizing the workpiece to expose the second metal feature. In some instances, the encapsulating layer includes silicon oxide, silicon oxycarbide, silicon oxynitride, silicon carbonitride, or silicon oxy-carbonitride and the gap-fill material includes silicon oxide doped with hydrocarbons. In some implementations, the blocking agent further includes a tail. The head group includes a phosphate group, a sulfate group, a silanol group, a thiol group, a phosphinic acid group, a sulfonic acid group, a stearic acid group, a phosphonic acid group, an amine group, a thiazole group, a carboxamide group, or a nitrogen-containing heterocyclic group; and the tail includes a straight hydrocarbon, a cyclic hydrocarbon, a cyclic hydrocarbon, or a branched hydrocarbon. In some instances, the first metal feature consists essentially of a first metal and the capping layer consists essentially of a second metal different from the first metal. In those instances, the first metal and the second metal are selected from the group consisting of copper, cobalt, ruthenium, molybdenum, chromium, tungsten, manganese, rhodium, iridium, nickel, palladium, platinum, silver, gold, and aluminum. In some embodiments, the ESL includes aluminum oxide, zirconium oxide, yittrium oxide, hafnium oxide, tantalum nitride, or titanium nitride.

In still another embodiment, an integrated circuit device is provided. The integrated circuit device includes a first metal feature in a dielectric layer and a capping layer over the first metal feature; and a second metal feature coupled to the capping layer at an interface. The capping layer and the interface are free of metal nitride.

In some embodiments, sidewalls of the second metal feature are lined by an encapsulating layer and the encapsulating layer includes silicon oxide, silicon oxycarbide, silicon oxynitride, silicon carbonitride, or silicon oxy-carbonitride. In some implementations, the metal nitride includes titanium nitride or tantalum nitride. In some instances, the first metal feature consists essentially of a first metal and the capping layer consists essentially of a second metal different from the first metal. In those instances, the first metal and the second metal are selected from the group consisting of copper, cobalt, ruthenium, molybdenum, chromium, tungsten, manganese, rhodium, iridium, nickel, palladium, platinum, silver, gold, and aluminum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a workpiece including a first metal feature in a dielectric layer and a capping layer over the first metal feature;
selectively depositing a blocking layer over the capping layer;
depositing an etch stop layer (ESL) over the workpiece, wherein the blocking layer prevents the ESL from being vertically aligned with the capping layer; and
removing the blocking layer,
wherein the selectively depositing of the blocking layer comprises use of a blocking agent,
wherein the blocking agent comprises 1-Octadecanethiol, 1-Dodecanethiol, Stearic acid, 4-Dodecylbenzenesulfonic acid, dimethyl octadecylphosphonate, Bi (Dodecyl) Dithiophosphinic Diethyl-n-Octadecylphosphonate, Acids, Bi (octadecyl) Dithiophosphinic Acids, Octadecylphosphonic acid, Decylphosphonic acid, Tetradecylphosphonic acid, 2-mercaptobenzothiazole, 2-mercaptobenzoxazole, 2-mercaptobenzimidazole, Benzothiazol, Benzoxazole, Benzimidazole, 2-Methylbenzimidazole, 5,6-Dimethylbenzimidazole, 2-(Methylthio)benzimidazole, 1,2,3-triazole, 1,2,4-triazole, 3-Amino-1,2,4-triazole, 1-Hydroxybenzotriazole hydrate, 4-Methyl-1H-benzotriazole, 5-Methyl-1H-benzotriazole, 5,6-Dimethyl-1H-benzotriazole, 4-Hydroxy-1H-benzotriazole, Benzotriazole-1-carboxamide, 2-Methylbenzothiazole, Imidazole, Methimazole, 5-Phenyl-1H-tetrazole, Benzotriazole, 5-(3-Aminophenyl)tetrazole, 4-Amino-4H-1,2,4-triazole, 3-Amino-5-mercapto-1,2,4-triazole, 3-Amino-5-methylthio-1H-1,2,4-triazole, 2-aminopyrimidine, 2-mercaptopyrimidine, Adenine, Hypoxanthine, Morpholine, 5-Amino-1,3,4-thiadiazole-2-thiol, Tryptophan, Histidine, 5-(Trifluoromethyl)-1H-1,2,3-benzotriazole, 1H-Benzotriazole, 1-(4-morpholinylmethyl), Phenothiazine, Purine, Melamine, Trithiocyanuric acid, 1,3,4-Thiadiazole-2,5-diamine, 3,5-Diamino-1,2,4-triazole, 5-Aminotetrazole, 3,6-Bis(methylthio)-1,2,4,5-tetrazine, or Aminophylline.

2. The method of claim 1, wherein the capping layer comprises copper, cobalt, ruthenium, molybdenum, chromium, tungsten, manganese, rhodium, iridium, nickel, palladium, platinum, silver, gold, or aluminum.

3. The method of claim 1, wherein the etch stop layer (ESL) comprises a conductive material.

4. The method of claim 3, wherein the etch stop layer (ESL) comprises titanium nitride or tantalum nitride.

5. The method of claim 1, wherein the etch stop layer (ESL) comprises a dielectric material.

6. The method of claim 5, wherein the etch stop layer (ESL) comprises aluminum oxide, zirconium oxide, yttrium oxide, hafnium oxide, titanium oxide, or tantalum oxide.

7. The method of claim 1, wherein the depositing of the etch stop layer (ESL) comprises performing a chemical vapor deposition (CVD) process or an atomic layer deposition (ALD) process.

8. The method of claim 1, wherein the removing of the blocking layer comprises performing an etching process using a plasma that functions as a reducing agent.

9. The method of claim 8, wherein the plasma comprises ammonia ($NH_3$) plasma or hydrogen ($H_2$) plasma.

10. A method, comprising:
receiving a workpiece comprising a conductive feature adjacent to a dielectric layer, wherein a top surface of the workpiece comprises a first top surface of the conductive feature and a second top surface of the dielectric layer;
treating the workpiece with a blocking agent to selectively form a blocking layer on the first top surface without forming the blocking layer on the second top surface;
forming a material layer on the second top surface without forming the material layer on the blocking layer; and
removing the blocking layer after the forming of the material layer,
wherein the blocking agent comprises 1-Octadecanethiol, 1-Dodecanethiol, Stearic acid, 4-Dodecylbenzenesulfonic acid, dimethyl octadecylphosphonate, Bi (Dodecyl) Dithiophosphinic Acids, Bi (octadecyl) Dithiophosphinic Acids, Diethyl-n-Octadecylphosphonate, Octadecylphosphonic acid, Decylphosphonic acid, Tetradecylphosphonic acid, 2-mercaptobenzothiazole, 2-mercaptobenzoxazole, 2-mercaptobenzimidazole, Benzothiazol, Benzoxazole, Benzimidazole, 2-Methylbenzimidazole, 5,6-Dimethylbenzimidazole, 2-(Methylthio)benzimidazole, 1,2,3-triazole, 1,2,4-triazole, 3-Amino-1,2,4-triazole, 1-Hydroxybenzotriazole hydrate, 4-Methyl-1H-benzotriazole, 5-Methyl-1H-benzotriazole, 5,6-Dimethyl-1H-benzotriazole, 4-Hydroxy-1H-benzotriazole, Benzotriazole-1-carboxamide, 2-Methylbenzothiazole, Imidazole, Methimazole, 5-Phenyl-1H-tetrazole, Benzotriazole, 5-(3-Aminophenyl)tetrazole, 4-Amino-4H-1,2,4-triazole, 3-Amino-5-mercapto-1,2,4-triazole, 3-Amino-5-methylthio-1H-1,2,4-triazole, 2-aminopyrimidine, 2-mercaptopyrimidine, Adenine, Hypoxanthine, Morpholine, 5-Amino-1,3,4-thiadiazole-2-thiol, Tryptophan, Histidine, 5-(Trifluoromethyl)-1H-1,2,3-benzotriazole, 1H-Benzotriazole, 1-(4-morpholinylmethyl), Phenothiazine, Purine, Melamine, Trithiocyanuric acid, 1,3,4-Thiadiazole-2,5-diamine, 3,5-Diamino-1,2,4-triazole, 5-Aminotetrazole, 3,6-Bis(methylthio)-1,2,4,5-tetrazine, or Aminophylline.

11. The method of claim 10, wherein the conductive feature comprises copper, cobalt, ruthenium, molybdenum, chromium, tungsten, manganese, rhodium, iridium, nickel, palladium, platinum, silver, gold, or aluminum.

12. The method of claim 10, wherein the dielectric layer comprises silicon oxide.

13. The method of claim 10, wherein the material layer comprises titanium nitride or tantalum nitride.

14. The method of claim 10, wherein the material layer comprises a dielectric material.

15. The method of claim 10, wherein the forming of the material layer comprises performing a chemical vapor deposition (CVD) process or an atomic layer deposition (ALD) process to the workpiece.

16. The method of claim 10, wherein the removing of the blocking layer comprises exposing the workpiece to a removal plasma to remove the blocking layer from the first top surface.

17. The method of claim 16, wherein the removal plasma comprises ammonia ($NH_3$) plasma or hydrogen ($H_2$) plasma.

18. A method comprising:
   exposing a substrate comprising a conductive material having a first surface and a dielectric material having a second surface to a blocking agent, thereby selectively forming a blocking layer on the first surface leaving the second surface free of the blocking layer,
   wherein the blocking agent comprises 1-Octadecanethiol, 1-Dodecanethiol, Stearic acid, 4-Dodecylbenzenesulfonic acid, dimethyl octadecylphosphonate, Bi (Dodecyl)Dithiophosphinic Acids, Bi (octadecyl) Dithiophosphinic Acids, Diethyl-n-Octadecylphosphonate, Octadecylphosphonic acid, Decylphosphonic acid, Tetradecylphosphonic acid, 2-mercaptobenzothiazole, 2-mercaptobenzoxazole, 2-mercaptobenzimidazole, Benzothiazol, Benzoxazole, Benzimidazole, 2-Methylbenzimidazole, 5,6-Dimethylbenzimidazole, 2-(Methylthio)benzimidazole, 1,2,3-triazole, 1,2,4-triazole, 3-Amino-1,2,4-triazole, 1-Hydroxybenzotriazole hydrate, 4-Methyl-1H-benzotriazole, 5-Methyl-1H-benzotriazole, 5,6-Dimethyl-1H-benzotriazole, 4-Hydroxy-1H-benzotriazole, Benzotriazole-1-carboxamide, 2-Methylbenzothiazole, Imidazole, Methimazole, 5-Phenyl-1H-tetrazole, Benzotriazole, 5-(3-Aminophenyl)tetrazole, 4-Amino-4H-1,2,4-triazole, 3-Amino-5-mercapto-1,2,4-triazole, 3-Amino-5-methylthio-1H-1,2,4-triazole, 2-aminopyrimidine, 2-mercaptopyrimidine, Adenine, Hypoxanthine, Morpholine, 5-Amino-1,3,4-thiadiazole-2-thiol, Tryptophan, Histidine, 5-(Trifluoromethyl)-1H-1,2,3-benzotriazole, 1H-Benzotriazole, 1-(4-morpholinylmethyl), Phenothiazine, Purine, Melamine, Trithiocyanuric acid, 1,3,4-Thiadiazole-2,5-diamine, 3,5-Diamino-1,2,4-triazole, 5-Aminotetrazole, 3,6-Bis(methylthio)-1,2,4,5-tetrazine, or Aminophylline.

19. The method of claim 18, further comprising:
   after the selectively forming of the blocking layer, selectively forming a first material layer on the second surface over the blocking layer; and
   after the selectively forming of the first material layer, removing the blocking layer; and
   forming a second material layer on the first surface.

20. The method of claim 18, wherein the blocking agent comprises a head group and a tail, the head group comprises functional groups that are bondable to the first surface.

* * * * *